(12) United States Patent
Wan et al.

(10) Patent No.: US 8,053,894 B2
(45) Date of Patent: Nov. 8, 2011

(54) SURFACE TREATMENT OF METAL INTERCONNECT LINES

(75) Inventors: Wen-Kai Wan, Hsin-Chu (TW);
Yih-Hsiung Lin, Sanchung (TW);
Ming-Ta Lei, Hsin-Chu (TW);
Baw-Ching Perng, Hsin-Chu (TW);
Cheng-Chung Lin, Taipei (TW);
Chia-Hui Lin, Hsin-Chu (TW); Ai-Sen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/213,238

(22) Filed: Aug. 26, 2005

(65) Prior Publication Data
US 2006/0001160 A1    Jan. 5, 2006

(51) Int. Cl.
*H01L 23/48*    (2006.01)
(52) U.S. Cl. ........................... 257/762; 257/750
(58) Field of Classification Search ............ 257/734, 257/750, 762, 766
See application file for complete search history.

(56) References Cited

U.S. PATENT DOCUMENTS

| | | | |
|---|---|---|---|
| 4,397,812 A | 8/1983 | Mallory, Jr. | |
| 5,380,546 A | 1/1995 | Krishnan et al. | |
| 5,680,092 A * | 10/1997 | Yamada et al. | 338/309 |
| 5,969,422 A * | 10/1999 | Ting et al. | 257/762 |
| 6,020,021 A | 2/2000 | Mallory, Jr. | |
| 6,130,157 A | 10/2000 | Liu et al. | |
| 6,225,210 B1 | 5/2001 | Ngo et al. | |
| 6,261,950 B1 | 7/2001 | Tobben et al. | |
| 6,339,025 B1 | 1/2002 | Liu et al. | |
| 6,342,733 B1 | 1/2002 | Hu et al. | |
| 6,368,948 B1 | 4/2002 | Ngo et al. | |
| 6,383,925 B1 | 5/2002 | Ngo et al. | |
| 6,406,996 B1 | 6/2002 | Bernard et al. | |
| 6,410,426 B1 | 6/2002 | Xing et al. | |
| 6,432,822 B1 | 8/2002 | Ngo et al. | |
| 6,500,749 B1 | 12/2002 | Liu et al. | |
| 6,509,267 B1 | 1/2003 | Woo et al. | |
| 6,605,874 B2 * | 8/2003 | Leu et al. | 257/758 |
| 6,696,758 B2 * | 2/2004 | Dubin et al. | 257/750 |
| 6,936,925 B1 * | 8/2005 | Lopatin et al. | 257/762 |

(Continued)

FOREIGN PATENT DOCUMENTS
DE    10113857 A1    10/2002
(Continued)

OTHER PUBLICATIONS

Saito, T., et al., "A Novel Copper Interconnection Technology Using Self Aligned Metal Capping Method," 2001 IEEE, pp. 15-17.

*Primary Examiner* — Bradley K Smith
(74) *Attorney, Agent, or Firm* — Slater & Matsil, L.L.P.

(57) ABSTRACT

Apparatus for forming a semiconductor structure comprising a first layer on top of a substrate wherein the first layer defines conductive regions such as copper interconnect lines and non-conductive regions such as dielectric materials. The conductive regions are covered by a second layer of a material different than the first layer such as for example nickel and then the structure is heat treated such that the interconnect lines and second metal, such as a copper interconnect line and a nickel second layer, interact with each other to form an alloy layer. The alloy layer has superior qualities for adhering to both the copper interconnect lines and a subsequently deposited dielectric material.

24 Claims, 1 Drawing Sheet

U.S. PATENT DOCUMENTS

| | | |
|---|---|---|
| 7,008,871 B2 * | 3/2006 | Andricacos et al. .......... 257/758 |
| 7,129,534 B2 * | 10/2006 | Tuttle ............................ 257/295 |
| 2001/0029081 A1 * | 10/2001 | Yokoyama .................... 438/400 |
| 2002/0098681 A1 | 7/2002 | Hu et al. |
| 2003/0054633 A1 | 3/2003 | Lee et al. |
| 2003/0148618 A1 | 8/2003 | Parikh |
| 2004/0018675 A1 * | 1/2004 | Test et al. ...................... 438/202 |
| 2004/0157433 A1 * | 8/2004 | Sinha et al. ................... 438/652 |

FOREIGN PATENT DOCUMENTS

| | | |
|---|---|---|
| WO | WO 03/011479 A1 | 2/2003 |

* cited by examiner

SURFACE TREATMENT OF METAL INTERCONNECT LINES

This application claims the benefit of U.S. Non-Provisional Application No. 10/439,358, filed on May 16, 2003, entitled "Surface Treatment Of Metal Interconnect Lines", now U.S. Pat. No. 6,955,984, issued Oct. 18, 2005, which application is hereby incorporated herein by reference.

TECHNICAL FIELD

The present invention relates generally to the use of a capping layer over conductors formed by a Damascene etch scheme, and more particularly to the use of forming an alloy layer comprised of metal from the metal conductors deposited by the Damascene process and a second metal formed over the conductors or leads.

BACKGROUND

As is well known by those skilled in the art, a continuing goal in manufacturing and production of semiconductors is a reduction in size of components and circuits with the concurrent result of an increase in the number of circuits and/or circuit elements such as transistors, capacitors, etc., on a single semiconductor device. This relentless and successful reduction in size of the circuit elements has also required reduction in the size of the conductive lines connecting devices and circuits. However, as the conducting lines are designed to be smaller and smaller, the resistance of the interconnects increases. Further, as the number of dielectric layers increases, the capacitive coupling between lines on the same level and adjacent level increases.

In the past, aluminum was used as the metal interconnect lines and silicon oxide as the dielectric. However, newer manufacturing techniques now favor copper as the metal for interconnect lines and various low K materials (organic and inorganic) are favored as the dielectric material. Not surprisingly, these material changes have required changes in the processing methods. In particular, because of the difficulty of etching copper without also causing unacceptable damage to the dielectric material, the technique of forming the metal interconnect lines has experienced significant changes. Namely, whereas aluminum interconnects could be formed by depositing a layer of aluminum and then using photoresist, lithography, and etching to leave a desired pattern of aluminum lines, the formation of copper interconnect lines are typically formed by a process now commonly referred to as a Damascene process. The Damascene process is almost the reverse of etching, and simply stated a trench, canal or via is cut, etched or otherwise formed in the underlying dielectric and is then filled with metal (i.e., copper).

Unfortunately, although copper has the advantages discussed above, it readily diffuses into dielectric material used in the manufacture of semiconductor devices, and it diffuses especially easily into silicon dioxide. Diffusion of copper into the dielectric materials of a semiconductor deice can cause serious reliability problems including electrical shorts. Therefore, it is typical to form a barrier layer between the copper used for conductors and leads and the dielectric material of a semiconductor device. Typical barrier layers may be formed of Ta (tantalum), TaN (tantalum nitride), Ti (titanium), TiN (titanium nitride) and various combinations of these metals as well as other metal. The barrier layer is typically formed on the bottom and sidewalls of the trenches and vias of the copper interconnects to prevent the copper from diffusing into the surrounding silicon dioxide as other dielectric material. A layer of silicon nitride is then typically deposited as a cover layer over the complete structure including the conductor areas and the dielectric layer before another layer or level of dielectric structure is deposited.

Unfortunately, silicon nitride adheres poorly to copper and may peel away thereby creating poor interface properties including a path for copper to diffuse into the subsequent or cover layer of dielectric material. The same path may also allow moisture and contaminants to diffuse from outside into the copper so as to form porous copper oxide.

Various ones of the above-mentioned problems have been addressed by the prior art, but none of the known prior art provides a solution to all of the problems in the simple and elegant method provided by the present invention. For example, U.S. Pat. No. 5,380,546, entitled "Multilevel Metallization Process for Electronic Components" and issued to Krishnan, et al., teaches the use of tungsten as both a barrier layer and a capping layer, but does not teach the unique method of forming an alloy as taught by the present invention. U.S. Pat. No. 6,130,157, entitled "Method to Form an Encapsulation Layer Over Copper Interconnects" issued to Liu, et al., teaches the use of several metals as a barrier layer and "treats" a tungsten capping layer with a nitrogen plasma, but does not teach nickel as the capping layer or simply heating to form an alloy as taught by the method of the present invention. U.S. Pat. No. 6,261,950, entitled "Self-Aligned Metal Caps for Interlevel Metal Connections" issued to Tobben, et al., does not teach the use of a barrier layer and teaches a first embodiment that selectively deposits a capping layer, but does not teach forming an alloy. The '950 patent also teaches a second embodiment that does not selectively deposit a second metal but does include a heat treatment although at a greater temperature than the present invention. A paper by T. Saito, et al., in proceedings of the IITC in 2001 at pages 15-17 teaches a self aligned metal capping process for Copper damascene interconnect. A Tungsten capping layer is selectively formed on the Cu interconnect using the preferential deposition phenomenon of W-CVD assisted by pre and post treatment. This technology is applied to 0.2 µm bipolar-CMOS LSI with multilevel Cu interconnects, and then yield, reliability and operation speed are evaluated.

SUMMARY OF THE INVENTION

These and other problems are generally solved or circumvented, and technical advantages are generally achieved, by the present invention which discloses methods and apparatus for forming a semiconductor structure comprising a first layer comprised of conductive regions such as copper or other metal interconnect lines and non-conductive regions such as a silicon dioxide dielectric or other non-conductive materials. A layer of a second metal that is different from the metal of the conductive regions is formed or deposited on the conductive region such as by a electrochemical deposition process including electroless plating. The electroless plating may be carried out by placing the substrate with the conductive and non-conductive region into a electroless plating chemical bath comprised of a metal ion chelate (such as a Ni (nickel ion chelate), a reduction agent such as sodium hypophosphite or Hydrazine and, if necessary, one or more agents or additives such as the accelerator sodium adipate, etc. The substrate including the layer of a first metal formed as the conductive region and the second metal of the cover layer interact to form an alloy such as for example, a copper/nickel (Cu/Ni) alloy.

The surface of the second Cu/Ni layer is then cleaned by one or more various cleaning processes well known by those skilled in the art.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
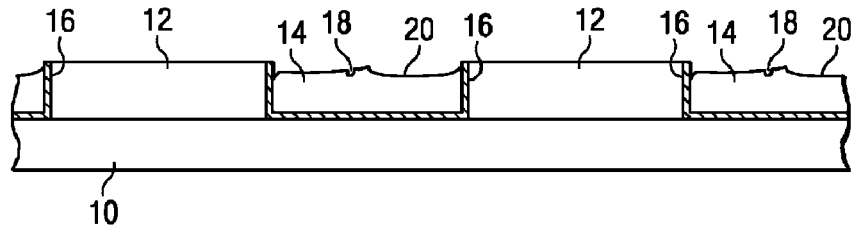
FIG. 1 is a prior art illustration of a semiconductor structure comprising a substrate covered by conductive regions and non-conductive regions.

Referring now to FIG. 1, there is shown a typical semiconductor structure including a substrate 10 having a first layer of non-conductive regions 12 and conductive or interconnect regions 14. It should be appreciated that the term substrate 10 as used herein may simply be a silicon wafer or alternately may represent one or more layers of various semiconductor devices including interconnecting metalization layers. Thus, the term substrate is intended to be broadly interpreted. For example, typically the substrate 10 may be comprised of a dielectric layer similar to the non-conductive regions 12 of FIG. 1.

As is well known by those skilled in the art, the use of the Damascene process and the use of copper as the interconnecting layers has created new problems while at the same time solving other problems. For example, when the conducting or interconnecting lines are made of copper, the copper may diffuse into the surrounding non-conductive or substrate areas if steps are not taken to prevent such diffusion. Thus, as shown in FIG. 1 there is also included a barrier layer 16, which stops or hinders the diffusion of the copper ions from the copper interconnecting strip 14 into the surrounding non-conductive portions or regions 12 and the substrate 10. Suitable barrier layers are well known in the art and include, for example only, Ta (tantalum), TaN (tantalum nitride), Ti (titanium) and TiN (titanium nitride) and various combinations of these and other materials. Thus, when this barrier layer 16 is provided, diffusion of the copper into the surrounding materials is slowed if not substantially eliminated. Further, it is typical to include a cover layer over the non-conductive regions 12 and the conductive regions 14 of a material such as silicon nitride if still another layer of semiconductor devices is to be formed over the first layer 12 and 14. Unfortunately, as was discussed above, the silicon nitride does not adhere well to the copper interconnect line which will typically have been subjected to CMP. Further, the conductive layer such as a layer of copper may include rough areas with pockets such as pocket 18 and/or dish areas such as dish area 20. Thus, because of the poor adhesion qualities between the copper and the protective layer of silicon nitride, it is not uncommon for serious reliability problems to occur. For example, the layer of silicon nitride (not shown) may peel away leaving no barrier between the copper and the subsequent dielectric layer. Of course as will be appreciated by those skilled in the art, when the barrier of silicon nitride is absent, the copper ions will readily diffuse into the cover layer of a dielectric thereby often causing electrical shorts.

Figure 2A:
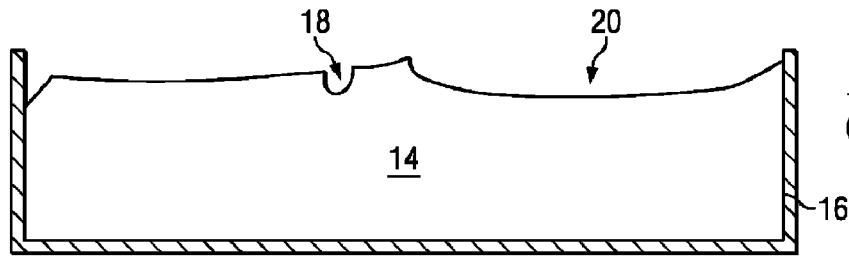
FIG. 2A is an enlarged view of conductive regions of FIG. 1.
Figure 2B:
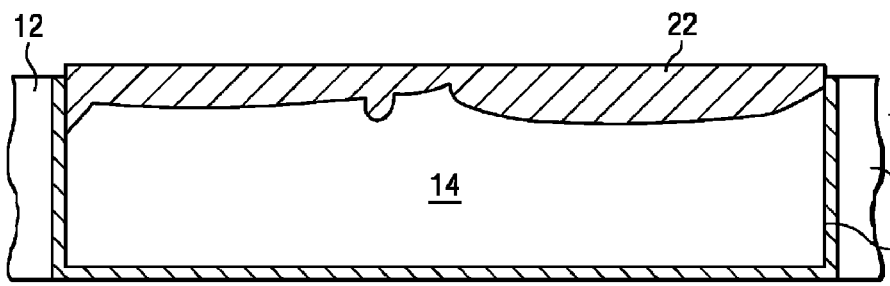
FIG. 2B illustrates the view of FIG. 1 after a second metal has been formed over the conductive regions according to the teachings of this invention.
Figure 2C:
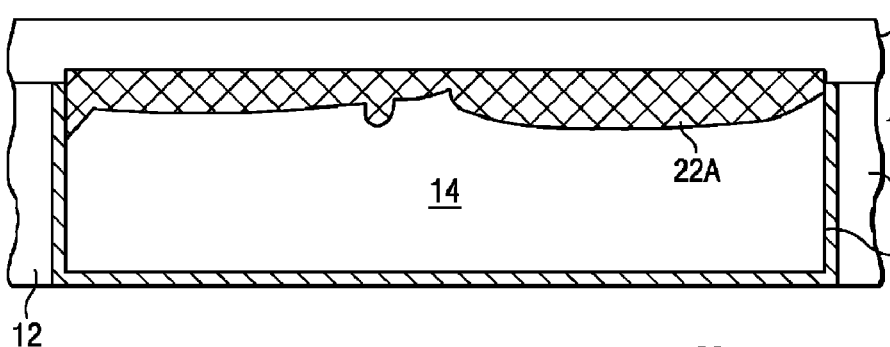
FIG. 2C illustrates the structure of FIG. 2B after heating the semiconductive structure so as to cause the metal of the conductive regions and the second metal to react with each other to form an alloy.

Referring now to FIG. 2A, there is illustrated an enlarged view of the conductive region or copper interconnect line 14 prior to the processes of the present invention. Therefore, according to the invention a second metal or layer of metal material is deposited over the metal interconnect or copper line 14 such as by electrochemical depositing a metal capping layer which will adhere only to the conductive regions or copper interconnect lines. To form the second layer of metal which adheres to the conductive regions or copper interconnect lines, an electroless plating process, such as ECD (Electroless Chemical Deposition) may be used which includes providing a solution of $NiCH_2$, and $H_2O$ or $NiSO_4$ and $H_2O$. According to another embodiment, an electrolyte solution or chemical bath may be used which includes a metal ion chelate such as for example a nickel ion chelate in the form of EDTA (elhylenediamine tetra-acetic acid) or a citric acid solution, a reduction agent such as for example Sodium Hypophosphite ($Na(H_2PO_2) H_2O$) or Hydrazine, and one or more additives. It may be desirable to use several additives for different purposes. For example, sodium adipate may be used as an accelerator, thiourea as a stabilizer, sodium carbonate or ammonia as a pH adjustor and ABS-Na as a brightener. Thus, by using the ECD process or an electrolyte solution for electroless depositing, a second metal, such as nickel, onto the surface of the copper interconnect lines 14, a second layer 22 of the second metal is formed over the copper interconnect lines 14. The combined semiconductor structure of the substrate, the layer of non-conductive region (or dielectric) and conductive regions (copper interconnect lines), and the second metal capping layer 22 formed of another metal different from copper, such as for example nickel, is then subjected to a heat treatment such as a sintering temperature of between 300° and 400° C. This heat treatment will cause an inter reaction between the two metals such as for example the copper and interconnect lines 14 and the deposited nickel 22 to form an alloy layer 22a of the two metals or Cu/Ni. The resulting alloy layer 22a will have improved adhesion with respect to a subsequent dielectric layer 23 and excellent adhering qualities with respect to the copper interconnect line 14 thereby eliminating the tendency of the silicon nitride to peel and further reducing the reliability problems. Other metals suitable for use as the metal capping layer include Co (cobalt) and Pd (palladium). The structure is then preferably cleaned by a standard post CMP cleaning process.

Figure 2D:
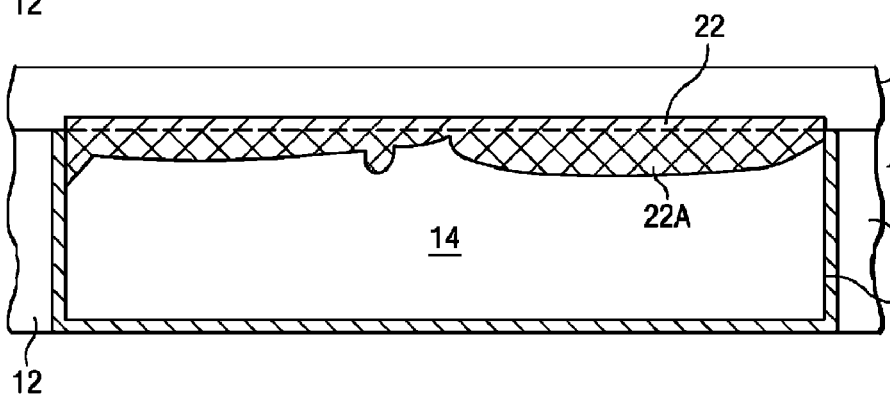
FIG. 2D illustrates an alternate embodiment of FIG. 2C wherein the thickness of the second metal layer was greater than the depth of the copper ion migration such that there is an alloy layer and a top layer of the second metal.

If the second metal layer is thick enough, or the heat treatment is of too short a duration, the copper ion migration into the second metal layer, (such as nickel), may not reach the top portions of the layer so that the top portion is comprised substantially of nickel alone without copper ions. In this situation, the combined structure will comprise the copper interconnect lines 14, an alloy layer 22a, a second metal layer 22, and dielectric layer 23 such as shown in FIG. 2D.

Although the present invention and its advantages have been described in detail, it should be understood that various changes, substitutions and alterations can be made herein without departing from the spirit and scope of the invention as defined by the appended claims. For example, it will be readily understood by those skilled in the art that dimensions and layer thickness may be varied while remaining within the scope of the present invention.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes, methods, or steps.

What is claimed is:

1. A semiconductor structure comprising:
    a substrate;
    a first layer in at least one non-conductive region on said substrate, the first layer substantially coplanar with a planar upper surface of the non-conductive region, said first layer defining at least one first level conductor formed of a first metal having a first sidewall surface, second sidewall surface, a bottom surface and a top surface and substantially free of a second metal, and a barrier region with sidewalls between the first sidewall surface and the second sidewall surface of the at least one first level conductor and the at least one non-conductive region;
    a dielectric layer over at least a portion of the at least one first level conductor;
    an alloy layer located between the top surface of the at least one first level conductor and the dielectric layer and in physical contact with only the top surface of the at least one first level conductor such that the at least one first level conductor and the dielectric layer are not in contact, said alloy layer comprising said second metal and said first metal, having a substantially planar upper surface, and contacting the sidewalls of the barrier region; and
    a second layer covering the alloy layer, said second layer comprising the second metal substantially free of said first metal.

2. The semiconductor structures of claim 1 wherein said layer of said second metal is an ECD (electrochemically deposited) metal.

3. The semiconductor structures of claim 1 wherein said second metal is an electroless plated metal.

4. The semiconductor structures of claim 1 wherein said substrate comprises at least one layer of semiconductor devices.

5. The semiconductor structure of claim 1 wherein said first metal is copper.

6. The semiconductor structure of claim 5 wherein said second metal is selected from the group consisting of Co (cobalt), Pd (palladium) and Ni (nickel).

7. The semiconductor structure of claim 1 wherein said second metal is selected from the group consisting of Co (cobalt), Pd (palladium) and Ni (nickel).

8. The semiconductor structure of claim 1 wherein said alloy comprises said second metal and ions of the first metal.

9. A semiconductor structure comprising:
    a substrate;
    a first layer on said substrate, said first layer comprising at least one copper region formed within at least one non-conductive region and substantially coplanar with a planar upper surface of the at least one non-conductive region, the first layer substantially free of nickel atoms forming a first level conductor having a first sidewall surface, a second sidewall surface, a bottom surface, and a top surface, and the at least one non-conductive region disposed over the first sidewall surface, the second sidewall surface and the bottom surface;
    a dielectric layer over the at least one copper region;
    an alloy layer directly on the only the top surface of the first level conductor and not extending to contact the sidewalls of the first level conductor in the at least one copper region that physically separates the dielectric layer from the at least one copper region, said alloy layer comprising nickel atoms and copper atoms and having a substantially planar surface facing away from the first layer; and
    a second layer covering the alloy layer, said second layer comprising the nickel atoms substantially free of copper atoms.

10. The semiconductor structure of claim 9 wherein said substrate comprises at least one layer of semiconductor devices.

11. A semiconductor structure comprising:
    a substrate;
    a first layer on said substrate, said first layer comprising at least one copper region substantially free of nickel atoms and forming a first level conductor formed within at least one non-conductive region and substantially coplanar with a planar upper surface of the at least one non-conductive region and having a first sidewall, a second sidewall, a bottom surface and a top surface, and the at least one non-conductive region covering the first sidewall, the second sidewall, and the bottom surface of the first level conductor;
    a portion of the dielectric layer over the first layer;
    an alloy layer located disposed on only the top surface of the first level conductor and not covering the sidewalls of the first level conductor formed in the at least one copper region and the second dielectric layer that isolates the second dielectric layer from the at least one copper region, said alloy layer comprising nickel atoms and copper atoms; and
    a second layer covering the alloy layer, said second layer comprising said nickel atoms substantially free of said copper atoms.

12. A semiconductor structure having capped interconnect lines to reduce metal diffusion from said interconnect lines into surrounding material comprising:
    a substrate;
    a layer of non-conductive material overlying said substrate and defining at least one trench therein;
    at least one interconnect line formed in said at least one trench and being substantially coplanar with a planar upper surface of the layer of non-conductive material, said at least one interconnect line having a first sidewall surface, a second sidewall surface, a bottom surface and a top surface and comprising a first metal and substantially free of a second metal;
    a barrier layer located between the first sidewall surface, the second sidewall surface and the bottom surface of the at least one interconnect line and the layer of non-conductive material, the barrier layer comprising a first top surface substantially parallel with a major surface of the substrate;
    a dielectric layer over the layer of non-conductive material;
    an alloy capping layer having at least one interface with only the top surface of and not contacting the sidewalls of the at least one interconnect line and physically isolating the at least one interconnect line from the dielectric layer, said alloy capping layer having a substantially planar top surface and comprising the second metal covering said at least one interconnect line and atoms from said first metal, wherein the alloy capping layer extends further towards the substrate than the first top surface of the barrier layer; and a second layer covering the alloy layer, said second layer comprising the second metal substantially free of said first metal.

13. The semiconductor structure of claim 12 further comprising a layer of semiconductor devices overlying said capped interconnect lines and said non-conductive material.

14. The semiconductor structure of claim 13 further comprising a layer of silicon nitride formed between said capped interconnect lines and said layer of semiconductor devices.

15. The semiconductor structure of claim 12 wherein said first metal is copper.

16. The semiconductor structure of claim 12 wherein said second metal is selected from the group consisting of Ni (nickel), Co (cobalt), and Pd (palladium).

17. A semiconductor structure comprising:

a substrate;

a first layer on said substrate, said first layer defining at least one first level conductor formed in and substantially coplanar with a planar upper surface of at least one non-conductive region on the substrate and having a first sidewall, a second sidewall, a bottom surface and a top surface, and formed of a first metal substantially free of a second metal and the at least one non-conductive region covering the first sidewall, the second sidewall and the bottom surface;

a portion of a dielectric layer over the first layer;

an alloy layer located disposed only on the top surface of and not on the first and second sidewalls of the at least one-first level conductor and disposed between the first level conductor and the second dielectric layer such that the at least one first level conductor and the dielectric layer are not in contact, said alloy layer comprising said second metal and said first metal; and a second layer covering the alloy layer, said second layer comprising the second metal substantially free of said first metal.

18. The semiconductor structure of claim 17 wherein said layer of said second metal is an ECD (electrochemically deposited) metal.

19. The semiconductor structure of claim 17 wherein said second metal is an electroless plated metal.

20. The semiconductor structure of claim 17 wherein said substrate comprises at least one layer of semiconductor devices.

21. The semiconductor structure of claim 17 wherein said first metal is copper.

22. The semiconductor structure of claim 21 wherein said second metal is selected from the group consisting of Co (cobalt), Pd (palladium) and Ni (nickel).

23. The semiconductor structure of claim 17 wherein said second metal is selected from the group consisting of Co (cobalt), Pd (palladium) and Ni (nickel).

24. The semiconductor structure of claim 17 further comprising a barrier layer formed between said conductive regions and said non-conductive regions.

* * * * *

UNITED STATES PATENT AND TRADEMARK OFFICE
CERTIFICATE OF CORRECTION

PATENT NO. : 8,053,894 B2  
APPLICATION NO. : 11/213238  
DATED : November 8, 2011  
INVENTOR(S) : Wan et al.

Page 1 of 2

It is certified that error appears in the above-identified patent and that said Letters Patent is hereby corrected as shown below:

In the Claims

Col. 5, line 22, claim 1, before "second sidewall surface" insert --a--.
Col. 5, line 42, claim 2, delete "structures" and insert --structure--.
Col. 5, line 45, claim 3, delete "structures" and insert --structure--.
Col. 5, line 47, claim 4, delete "structures" and insert --structure--.
Col. 5, line 59, claim 8, after "alloy" insert --layer--.
Col. 6, line 6, claim 9, after "directly on" delete "the".
Col. 6, line 8, claim 9, delete "walls" and insert --wall surfaces--.
Col. 6, line 32, claim 11, after "a portion of" delete "the" and insert --a--.
Col. 6, line 33, claim 11, after "an alloy layer" delete "located".
Col. 6, line 36, claim 11, after "region" delete "and the second dielectric layer".
Col. 6, line 37, claim 11, before "dielectric layer" delete "second".
Col. 6, line 41, claim 11, after "comprising" delete "said".
Col. 6, line 64, claim 12, after "contacting the" delete "sidewalls" and insert --sidewall surfaces--.
Col. 7, line 6, claim 12, after "the alloy" insert --capping--.
Col. 7, line 11, claim 13, before "capped" insert --at least one--.
Col. 7, line 11, claim 13, after "interconnect" delete "lines" and insert --line--.
Col. 7, line 13, claim 14, before "capped" insert --at least one--.
Col. 7, line 14, claim 14, delete "lines" and insert --line--.
Col. 8, line 1, claim 17, after "layer" delete "located".
Col. 8, line 3, claim 17, delete "one-first" and insert --one first--.
Col. 8, line 4, claim 17, after "and the" delete "second".
Col. 8, line 11, claim 18, after "said" insert --second--.
Col. 8, line 12, claim 18, after "layer" delete "of said second metal".
Col. 8, line 28, claim 24, after "between said" delete "conductive" and insert --at least one first level conductor--.

Signed and Sealed this  
Eleventh Day of March, 2014

Michelle K. Lee  
*Deputy Director of the United States Patent and Trademark Office*

Col. 8, line 29, claim 24, before "and said" delete "regions".
Col. 8, line 29, claim 24, after "said" insert --at least one--.
Col. 8, line 29, claim 24, after "non-conductive" delete "regions" and insert --region--.